(12) United States Patent
Pallerla et al.

(10) Patent No.: US 11,361,817 B2
(45) Date of Patent: Jun. 14, 2022

(54) PSEUDO-TRIPLE-PORT SRAM BITCELL ARCHITECTURE

(71) Applicant: QUALCOMM Incorporated, San Diego, CA (US)

(72) Inventors: Arun Babu Pallerla, San Diego, CA (US); Changho Jung, San Diego, CA (US); Sung Son, San Jose, CA (US); Jason Cheng, San Diego, CA (US); Yandong Gao, San Diego, CA (US); Chulmin Jung, San Diego, CA (US); Venugopal Boynapalli, San Diego, CA (US)

(73) Assignee: QUALCOMM INCORPORATED, San Diego, CA (US)

(*) Notice: Subject to any disclaimer, the term of this patent is extended or adjusted under 35 U.S.C. 154(b) by 0 days.

(21) Appl. No.: 17/002,082

(22) Filed: Aug. 25, 2020

(65) Prior Publication Data

US 2022/0068360 A1 Mar. 3, 2022

(51) Int. Cl.
*G11C 16/04* (2006.01)
*G11C 11/4096* (2006.01)
*G11C 11/408* (2006.01)
*G11C 5/02* (2006.01)
*G11C 11/4074* (2006.01)
*G11C 11/4094* (2006.01)

(52) U.S. Cl.
CPC ......... *G11C 11/4096* (2013.01); *G11C 5/025* (2013.01); *G11C 11/4074* (2013.01); *G11C 11/4085* (2013.01); *G11C 11/4094* (2013.01)

(58) Field of Classification Search
CPC . G11C 11/4096; G11C 5/025; G11C 11/4074; G11C 11/4085; G11C 11/4094
USPC .................................................. 365/185.13
See application file for complete search history.

(56) References Cited

U.S. PATENT DOCUMENTS

| 7,038,926 | B2* | 5/2006 | Jeong .................. H01L 27/1104 365/63 |
|---|---|---|---|
| 8,760,958 | B2 | 6/2014 | Iyer et al. |
| 8,902,672 | B2 | 12/2014 | Iyer et al. |
| 9,406,375 | B1 | 8/2016 | Barowski et al. |
| 9,570,153 | B1 | 2/2017 | Chen et al. |
| 10,411,019 | B2* | 9/2019 | Fujiwara ............... H01L 21/321 |
| 2002/0075732 | A1* | 6/2002 | Ueno .................. G11C 7/1048 365/198 |
| 2008/0198681 | A1 | 8/2008 | Kenkare et al. |
| 2011/0110174 | A1 | 5/2011 | Cho et al. |
| 2012/0120752 | A1 | 5/2012 | Widjaja |
| 2013/0286763 | A1 | 10/2013 | Wang |

(Continued)

FOREIGN PATENT DOCUMENTS

WO 0120612 A1 3/2001

*Primary Examiner* — Huan Hoang
(74) *Attorney, Agent, or Firm* — Haynes and Boone, LLP

(57) ABSTRACT

A bitcell architecture for a pseudo-triple-port memory is provided that includes a a bitcell arranged on a semiconductor substrate, the bitcell defining a bitcell width and a bitcell height and including a first access transistor and a second access transistor. A first metal layer adjacent the semiconductor substrate is patterned to form a pair of local bit lines arranged within the bitcell width. The pair of local bit lines includes a local bit line coupled to a terminal of the first access transistor and includes a complement local bit line coupled to a terminal of the second access transistor.

25 Claims, 15 Drawing Sheets

(56) References Cited

U.S. PATENT DOCUMENTS

| | | |
|---|---|---|
| 2014/0159773 A1 | 6/2014 | Shin |
| 2014/0185364 A1 | 7/2014 | Iyer et al. |
| 2014/0313844 A1 | 10/2014 | Lin |
| 2016/0064067 A1 | 3/2016 | Mojumder et al. |
| 2016/0141021 A1 | 5/2016 | Mojumder et al. |
| 2016/0163714 A1 | 6/2016 | Mojumder et al. |
| 2016/0181255 A1 | 6/2016 | Nii |
| 2016/0240539 A1 | 8/2016 | Mojumder et al. |
| 2017/0117060 A1 | 4/2017 | Sano et al. |
| 2019/0267079 A1 | 8/2019 | Moriwaki |
| 2020/0020390 A1 | 1/2020 | Fujiwara et al. |
| 2020/0301614 A1 | 9/2020 | Kern et al. |
| 2021/0118477 A1 | 4/2021 | Bringivijayaraghavan et al. |
| 2021/0183423 A1 | 6/2021 | Yang et al. |
| 2022/0063369 A1 | 3/2022 | Pallerla |
| 2022/0068371 A1 | 3/2022 | Pallerla |

\* cited by examiner forming a bitcell arranged on a semiconductor substrate, the bitcell having a bitcell width and a bitcell height and including a first access transistor and a second access transistor ~1400 patterning a first metal layer adjacent the semiconductor substrate to form a pair of local bit lines arranged within the bitcell width; the pair of local bit lines including a local bit line coupled to a terminal of the first access transistor and including a complement local bit line coupled to a terminal of the second access transistor ~1405 patterning a third metal layer adjacent a second metal layer that is adjacent to the first metal layer to form a first pair of global bit lines for the bitcell ~1410

FIG. 14

PSEUDO-TRIPLE-PORT SRAM BITCELL ARCHITECTURE

TECHNICAL FIELD

This application relates to memories, and more particularly to a bitcell architecture for a pseudo-triple-port static random-access memory (SRAM).

BACKGROUND

In a conventional static random-access memory (SRAM), a bitcell connects to a pair of bit lines through a corresponding pair of access transistors during a read operation. To switch on the access transistors during a read operation, a word line controller asserts the voltage of a word line that connects to a gate of each of the access transistors. The word line controller also asserts the word line to switch on the access transistors during a write operation. The pair of access transistors and corresponding bit lines may thus be treated as a single read port and a single write port to the bitcells. The pair of bit lines are shared by other bitcells and their corresponding access transistors. The resulting group of bitcells linked by their common bit line pair is typically denoted as a column of bitcells. Since there is just one bit line pair for the column, only a single read operation or a single write operation can occur each time the word line is asserted.

To accommodate applications such as video processing that require simultaneous multiple read or write operations to the same column, dual-port SRAMs have been developed. In a dual-port SRAM, each column has two pairs of bit lines. Each bitcell may thus have one pair of access transistors for coupling to one of the bit line pairs and have another pair of access transistors for coupling to another one of the bit line pairs. Although such dual-port SRAMs enable simultaneous read/write operations, the extra access transistors for each bitcell produce a lower density (the number of bitcells that may be implemented in a given area of die space).

Accordingly, there is a need in the art for multi-port memories having increased density.

SUMMARY

In accordance with a first aspect of the disclosure, a memory is provided that includes: a semiconductor substrate; a bitcell arranged on the semiconductor substrate, the bitcell having a bitcell width and a bitcell height and including a first access transistor and a second access transistor; a first metal layer adjacent the semiconductor substrate, the first metal layer being patterned to form a pair of local bit lines arranged within the bitcell width; the pair of local bit lines including a local bit line coupled to a terminal of the first access transistor and including a complement local bit line coupled to a terminal of the second access transistor; a second metal layer adjacent the first metal layer; and a third metal layer adjacent the second metal layer, the third metal layer being patterned to form a pair of word lines arranged within the bitcell height, the pair of word lines including a first read port word line coupled to a gate of the first access transistor and including a second read port word line coupled to a gate of the second access transistor.

In accordance with a second aspect of the disclosure, a method is provided that includes: forming a bitcell arranged on a semiconductor substrate, the bitcell having a bitcell width and a bitcell height and including a first access transistor and a second access transistor; patterning a first metal layer adjacent the semiconductor substrate to form a pair of local bit lines arranged within the bitcell width, the pair of local bit lines including a local bit line coupled to a terminal of the first access transistor and including a complement local bit line coupled to a terminal of the second access transistor; and patterning a third metal layer adjacent to a second metal layer that is adjacent to the first metal layer to form a pair of word lines arranged within the bitcell height, the pair of word lines including a first read port word line coupled to a gate of the first access transistor and including a second read port word line coupled to a gate of the second access transistor.

In accordance with a third aspect of the disclosure, a memory is provided that includes: a semiconductor substrate; a bitcell arranged on the semiconductor substrate, the bitcell having a bitcell width and a bitcell height and including a first access transistor and a second access transistor; a first metal layer adjacent the semiconductor substrate, the first metal layer being patterned to form a pair of local bit lines arranged within the bitcell width; the pair of local bit lines including a local bit line coupled to a terminal of the first access transistor and including a complement local bit line coupled to a terminal of the second access transistor; a second metal layer adjacent the first metal layer; and a third metal layer adjacent the second metal layer, the third metal layer being patterned to form a first pair of global bit lines for the bitcell.

In accordance with a fourth aspect of the disclosure, a method is provided that includes: forming a bitcell arranged on a semiconductor substrate, the bitcell having a bitcell width and a bitcell height and including a first access transistor and a second access transistor; patterning a first metal layer adjacent the semiconductor substrate to form a pair of local bit lines arranged within the bitcell width, the pair of local bit lines including a local bit line coupled to a terminal of the first access transistor and including a complement local bit line coupled to a terminal of the second access transistor; and patterning a third metal layer adjacent to a second metal layer that is adjacent to the first metal layer to form a first pair of global bit lines for the bitcell.

These and additional advantages may be better appreciated through the following detailed description.

BRIEF DESCRIPTION OF THE DRAWINGS

FIG. 14 is a flowchart for a method of manufacture of a pseudo-triple-port bitcell in accordance with an aspect of the disclosure.

Implementations of the present disclosure and their advantages are best understood by referring to the detailed description that follows. It should be appreciated that like reference numerals are used to identify like elements illustrated in one or more of the figures.

DETAILED DESCRIPTION

To solve the density problems of dual-port memories, an SRAM bitcell is provided with a pair of two independent word lines. A first word line in the pair drives the gate of a first access transistor for the bitcell. Similarly, a second word line in the pair of word lines drives the gate of a second access transistor for the bitcell. The first access transistor couples between a true output node for the bitcell and a bit line. Similarly, the second access transistor couples between a complement output node for the bitcell and a complement bit line. A read operation for the bitcell is single-ended since it involves just one of the bit lines and a corresponding one of the word lines.

Figure 1:
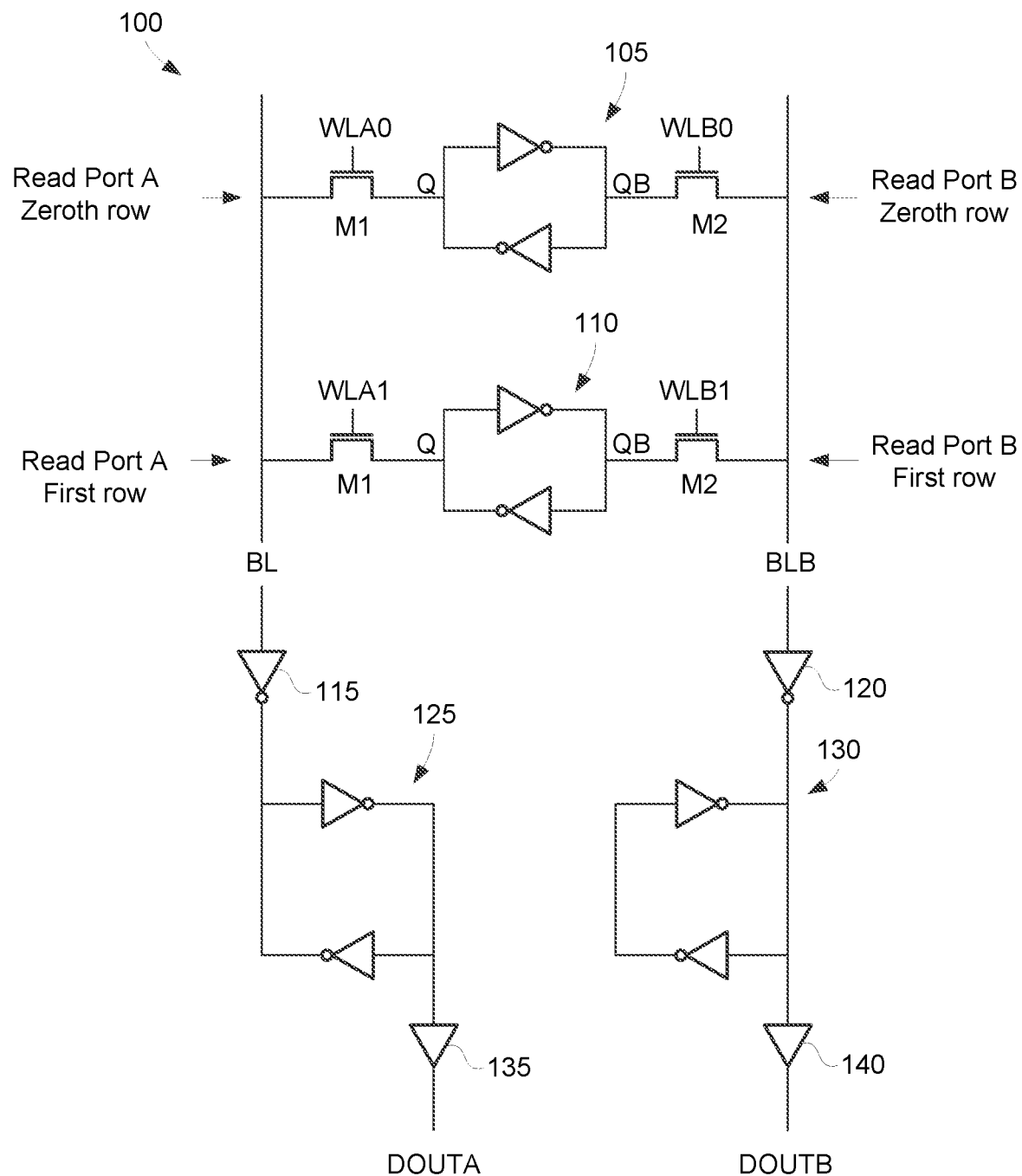
FIG. 1 illustrates a column of pseudo-triple-port SRAM bitcells in accordance with an aspect of the disclosure.

A plurality of the bitcells are arranged into a column of bitcells and share the bit line and the complement bit line. Each bitcell has its own first access transistor and second access transistor controlled by a corresponding pair of word lines. An example column 100 is shown in FIG. 1. Column 100 includes a first bitcell 105 and a second bitcell 110 but it will be appreciated that column 100 may include additional bitcells that are not shown for illustration clarity. Each bitcell is within its own row of other bitcells (not illustrated) that share a corresponding pair of word lines. For example, bitcell 105 is arranged in a zeroth row of bitcells. Similarly, bitcell 110 is in a first row of bitcells.

A read port A word line WLA0 extends across the zeroth row and drives a first n-type metal-oxide semiconductor (NMOS) access transistor M1 in bitcell 105. The read port A word line WLA0 similarly drives other first access transistors in the remaining bitcells (not illustrated) in the zeroth row. A read port B word line WLB0 also extends across the zeroth row and drives a second NMOS access transistor M2 in bitcell 105. The read port B word line WLB0 similarly drives other second access transistors (not illustrated) in the zeroth row. Since the word lines are controlled independently during a read operation, the combination of the bit line BL, the read port A word line WLA0, and the access transistor M1 form a read port A for bitcell 105. The bit line BL may thus also be denoted as the read port A bit line. Similarly, the combination of the complement bit line BLB, the read port B word line WLB0, and the access transistor M2 form a read port B for bitcell 105. The complement bit line BLB may thus also be denoted as a read port B bit line.

The word line pair for the first row of bitcells is analogous. For example. a read port A word line WLA1 in the word line pair extends across the first row to drive access transistor M1 in bitcell 110. The read port A word line WLA1 similarly drives other first access transistors in the remaining bitcells (not illustrated) in the first row. A read port B word line WLB1 extends across the first row to drive access transistor M2 in bitcell 110. The read port B word line WLB1 similarly drives other second access transistors (not illustrated) in the first row. Bitcell 110 thus has a read port A from a combination of its access transistor M1, the bit line BL, and the read port A word line WLA1. Similarly, bitcell has a read port B from a combination of its access transistor M2, the complement bit line BLB and the read port B word line WLB1.

Suppose that read port A is accessed in bitcell 105 through an assertion of a voltage for the word line WLA0. Since access transistor M1 couples between the true output node (Q) of bitcell 105, the voltage of bit line BL will be charged accordingly to the binary contents of bitcell 105 when the voltage of the read port A word line WLA0 is asserted. If bitcell 105 is storing a binary one in a binary-high convention, the output node Q of bitcell 105 will thus be charged to the power supply voltage. Prior to the read operation, the bit line BL is charged to the power supply voltage. During the read operation to read port A, the bit line BL will thus remain charged to the power supply voltage when bitcell 105 is storing a binary one. But if the bitcell 105 had been storing a binary zero, the read operation to read port A would cause the bit line BL to be discharged towards ground while the access transistor M1 is switched on.

Figure 2:
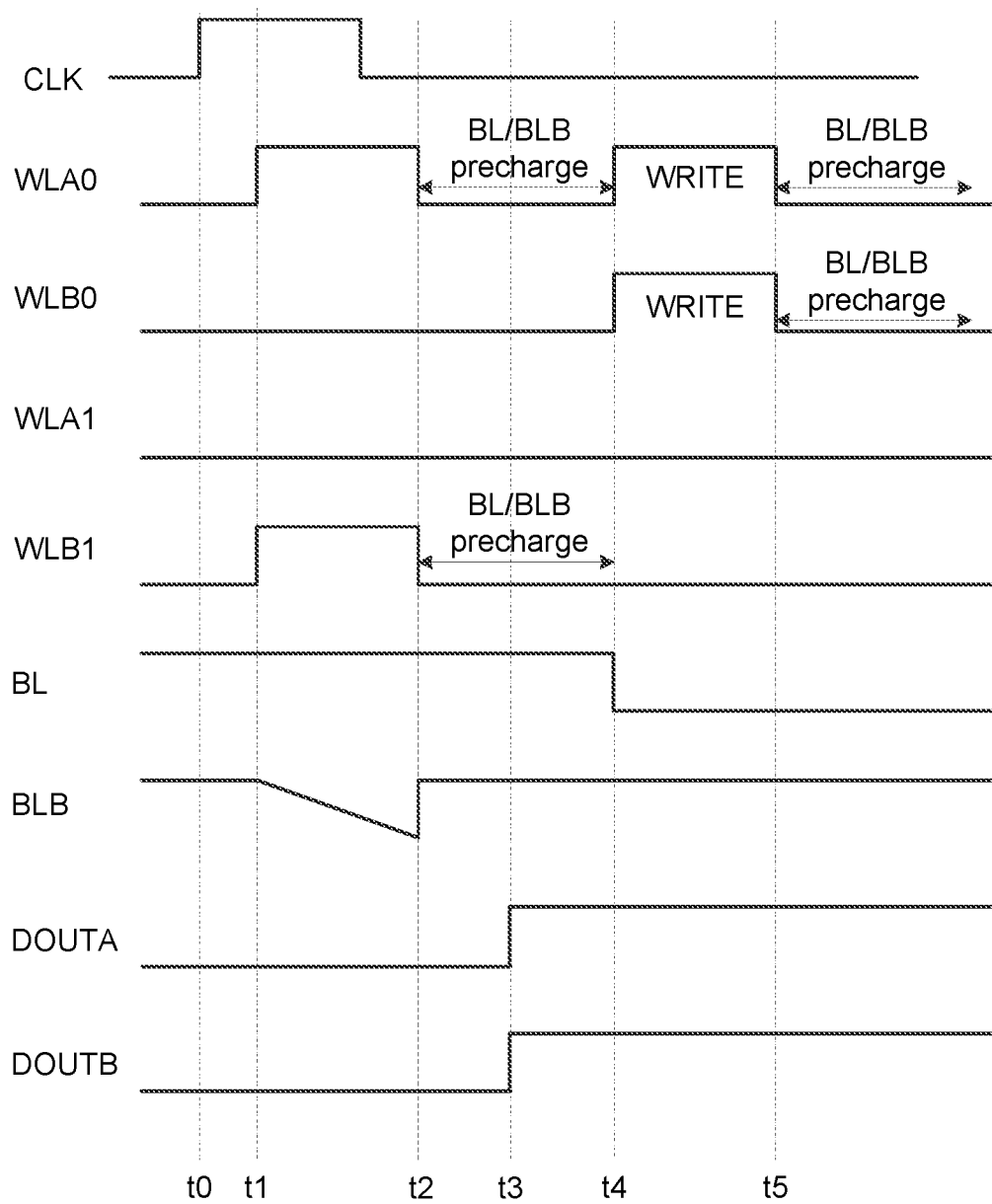
FIG. 2 is a timing diagram for various signals in the column of pseudo-triple-port SRAM bitcells of FIG. 1.

During a read operation to column 100, two different bitcells may be read from simultaneously. Some example waveforms for such a simultaneous read operation are shown in FIG. 2. Prior to an assertion of a memory clock signal CLK at a time t0, the bit line BL and the complement bit line BLB are charged to the memory power supply voltage. The assertion of the memory clock signal at time t0 triggers a read cycle followed by a write cycle in one period of the memory clock signal CLK. From a time t1 to a time t2, the read port A word line WLA0 for the zeroth row is asserted. There is thus a read port A access from time t1 to time 2 to bitcell 105. In this example, it is assumed that bitcell 105 is storing a binary one such that the Q output node of bitcell 105 is charged to the power supply voltage. Bit line BL thus remains charged to the power supply voltage during the word line assertion period from time t1 to time t2. During the same word line assertion period from time t1 to time 2, the read port B word line WLB1 for the first row is asserted to perform a read port B access to bitcell 110. In this example, it is assumed that bitcell 110 is also storing a binary one such that its complement output node (QB) is discharged to ground. The complement bit line BLB is thus discharged towards ground during the word line assertion period from time t1 to time t2. The read port B access that occurs from time t1 to time t2 is simultaneous with the read port A access.

Since a read access through one of the bit lines in the bit line pair does not use the voltage of the remaining bit line, the resulting read operation is single-ended. An inverter and latch combination may thus be used as a latching sense amplifier for such single-ended bit decisions. It will be appreciated that column 100 is shown in simplified form in that bit line BL drives a read port A global bit line (global read bit line A) that is not shown for illustration clarity in FIG. 1. Similarly, complement bit line BLB drives a read port B global read bit line (global read bit line B) that is also not shown in FIG. 1. It is the global read bit lines that drive the inverter sense amplifiers. For example, an inverter 115 inverts a voltage of the global read bit line A to drive a latch 125 that latches a bit decision for the read-port-A-accessed bitcell such as bitcell 105. In this case, since the read operation is to read port A, the resulting data output signal (bit decision) from latch 125 may be designated as DOUTA. A buffer 135 may buffer the DOUTA signal in some implementations. Referring again to FIG. 2, the DOUTA signal is thus asserted to the power supply voltage at a time t3 by the action of inverter 115. Similarly, an inverter 120 inverts a voltage of the global read bit line B to drive a latch 130 that latches a bit decision for the read-port-B-accessed bitcell such as bitcell 110. Since the stored bit in bitcell 105 is being inverted by inverter 115, latch 125 inverts the output of inverter 115 to provide the DOUTA signal. Conversely, since read port B is driving the complement bit line BLB that is inverted by inverter 120, latch 130 is arranged so as to not invert the output of inverter 120. In this fashion, the output of latch 130 will equal the bit value (true or false) of the read-port-B-accessed bitcell such as bitcell 110. As used herein, "latch" refers to a storage cell for storing a bit. The resulting data output signal from read port B may be designated as DOUTB. A buffer 140 may buffer the DOUTB signal in some implementations. Referring again to FIG. 2, the DOUTB signal is driven to the power supply voltage at time t3 as a result of the read port B access to bitcell 110.

A write pre-charge period extends from time t2 to a time t4. In some implementations, a pre-charge circuit charges the bit line BL and the complement bit line BLB to the power supply voltage during the write pre-charge period. Thus, the bit line BL and the complement bit line BLB are shown as being charged to the power supply voltage during the write pre-charge period. A write port access then occurs from time t4 to a time t5 to bitcell 105.

At or before time t4, a write driver (not illustrated) drives the bit line BL with a write data bit signal (not illustrated). Similarly, the write driver drives the complement bit line BLB with a complement write data bit signal (not illustrated). The write data bit signal is a binary zero is this example, so the complement write bit signal is a binary one. With the write driver charging the bit line pair according to the write data bit signal, a word line controller asserts both the read access port A word line WLA0 and the read access port B word line WLB0 from time t4 to time t5 to write the write data bit signal to bitcell 105. Access transistor M1 and access transistor M2 are both switched on due to the simultaneous word line assertion during the write port access.

Suppose that the write data bit signal to be written to bitcell 105 is a binary zero. In that case, the bit line BL voltage is thus discharged during the write port access from time t4 to time t5. Conversely, the complement bit line BLB voltage remains charged during this write port access. The word line assertion period from time t4 to time t5 has a sufficient length so that the desired write data bit signal (in this example, a binary zero) is written into the accessed bitcell.

Referring again to the read port A and B access, note that while read port A is accessed for bitcell 105 from time t1 to time t2, no other bitcells such as bitcell 110 in column 100 can have a read access through their read port A as there would then be competition on bit line BL for the bit decision. But a simultaneous read operation may occur on read port B for another bitcell in column 100 such as described for bitcell 110. Since there is a read port B access to bitcell 110 in the current read cycle, no other bitcells in column 100 can have a read access through their read port B during the same read cycle as there would be contention on complement bit line BLB for the bit decision. During the word line assertion period for the read cycle from time t1 to time t2, read port B word line WLB1 is asserted to switch on access transistor M2 for bitcell 110. Each access transistor M2 connects between the complement output node (QB) of its bitcell and the complement bit line BLB. Should bitcell 110 be storing a binary zero, the read access through read port B will cause bit line BLB to remain charged to the power supply voltage. Conversely, should bitcell 110 be storing a binary one, the read access through read port B will cause bit line BLB to discharge while its access transistor M2 conducts. A read access through read port B will thus cause the complement bit line BLB to be charged according to the complement of the binary value stored in the accessed bitcell. Note that the same bitcell may be simultaneously accessed through its read port A and read port B in the same read cycle although the bit decisions would of course be the same in that case.

The resulting dual read ports A and B for the bitcells in column 100 are "pseudo read ports" since each bitcell has only two access transistors and the single pair of bit lines. In contrast, a bitcell with traditional dual read ports would have a pair of bit lines and a pair of access transistors for each port. Read ports A and B advantageously increase density as each bitcell may be formed from six transistors: the pair of access transistors M1 and M2 and four transistors to form the cross-coupled inverters within the bitcells as will be discussed further herein. The following discussion will also refer to pseudo-triple-port bitcells as simply "bitcells" for brevity.

The read operation (which may also be denoted herein as a read cycle) occurs during a first portion of a memory clock signal cycle. The write operation (which may also be denoted herein as a write cycle) may occur during a remaining second portion of the memory clock signal. The resulting read and write operation may thus be denoted as being "double pumped" in that both the read operation(s) and the write operation occur in one memory clock cycle.

Figure 3:
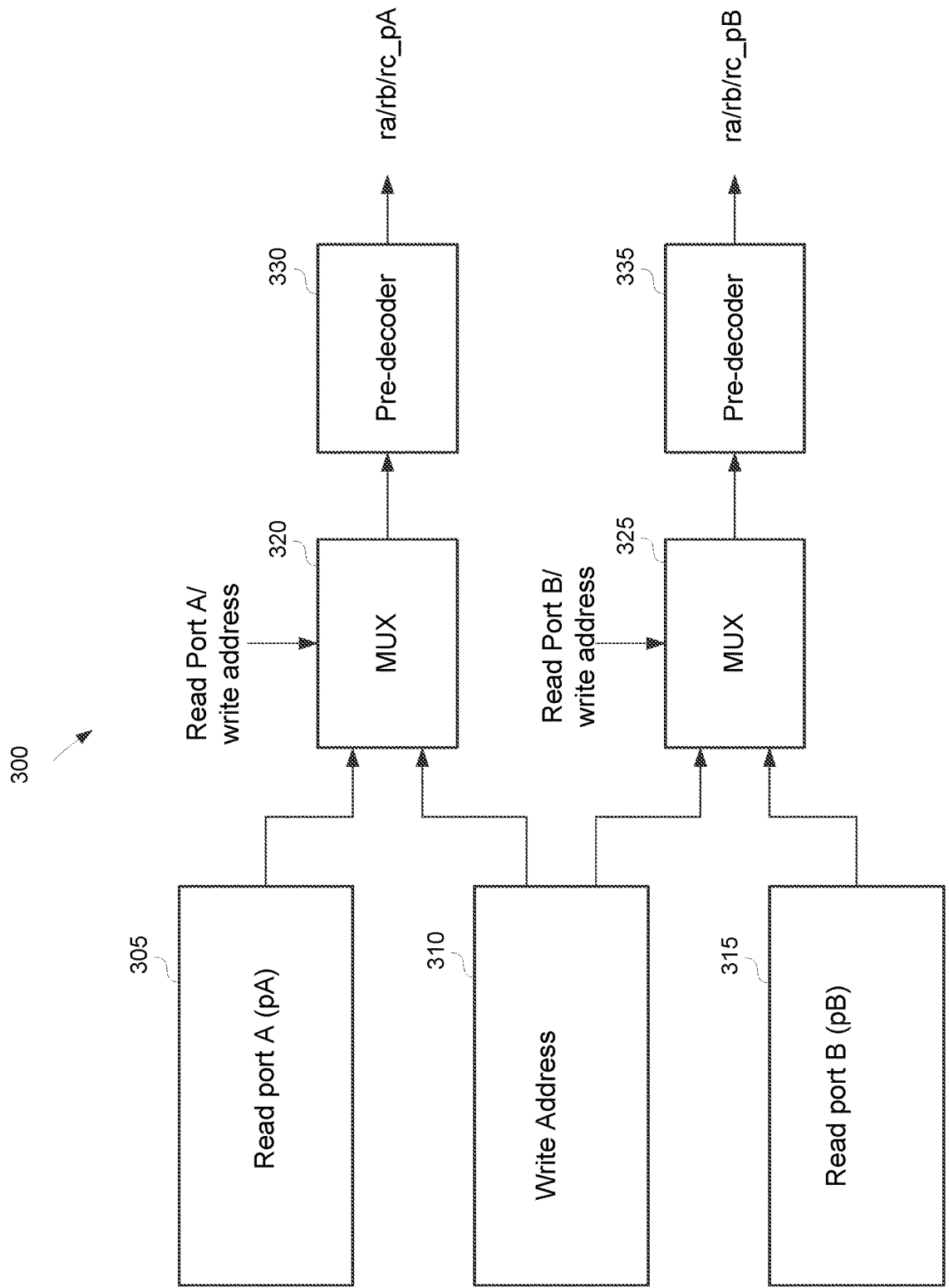
FIG. 3 illustrates an address selection and address pre-decoder circuit for a pseudo-triple-port memory in accordance with an aspect of the disclosure.

The word line address decoding for a pseudo-triple-port memory will now be discussed. For each row of bitcells, there is a corresponding pair of word lines formed by a read port A word line and a read port B word line. For example, the zeroth row of bitcells in column 100 may be accessed through an assertion of the read port A word line WLA0 or through an assertion of the read port B word line WLB0 during a read operation. If just one read port is accessed, the read word line voltage for the remaining read port is not asserted during the read operation. In contrast, both the word lines in a word line pair are asserted for an addressed row of bitcells during a write operation. An address selection circuit and pre-decoder 300 shown in FIG. 3 accommodates this selective activation of just one word line in a word line pair during a read operation and the activation of both the word lines in a word line pair during a write operation.

When the read port A is to be accessed during a read operation for an addressed row, a read port A address 305 identifies the addressed row. For example, suppose that there are 256 rows. Read port A address 305 may then be an 8-bit wide digital address to uniquely identify the addressed row.

More generally, an N-bit wide address may uniquely identify the addressed row from a plurality of $2^N$ rows, N being a positive integer. In the following discussion, the addressed row will be referred to as the ith row for brevity. For both a read port A access and a write operation to the ith row, the ith read port A word line voltage is asserted. Address selection circuit and pre-decoder 300 thus includes a multiplexer (MUX) 320 that selects for the read port A address 305 and a write address 310 depending upon whether a read port A operation or a write operation is active. Write address 310 is analogous to read port A address 305 in that write address 310 would have the requisite bit width to uniquely identify the addressed row. If a read operation over read port A is to occur, multiplexer 320 selects for the read port A address 305. If a write operation is to occur, multiplexer 320 selects for the write address 310.

A pre-decoder 330 pre-decodes the selected address from multiplexer 320. The following discussion will assume that pre-decoder 330 pre-decodes the selected address into three read port A pre-decoded word line address signals, but it will be appreciated that different numbers of pre-decoded word line address signals may be used in alternative implementations. A first read port A pre-decoded word line address signal may be designated as ra_pA. Similarly, a second read port A pre-decoded word line address signal may be designated as rb_pA whereas a third read port A pre-decoded word line address signal may be designated as rc_pA. The following discussion will assume that the pre-decoded address signals are active-low but active-high pre-decoded address signals may be used in alternative implementations. The read port A pre-decoded word line address signals may also be denoted herein as pre-decoded first word line address signals.

The bit width of a pre-decoded word line address signal determines the resulting word line addressing upon decoding. For example, a four-bit width for a pre-decoded word line address signal corresponds to assigning a read port's word lines into four different subsets. Similarly, an eight-bit width for a pre-decoded word line address signal corresponds to assigning the read port word lines into eight different subsets. Suppose that there are 256 read port A word lines to be selected from. If the pre-decoded first word line address signals ra_pA and rb_pA are both eight bits wide and the pre-decoded first word line address signal rC_p0 is four bits wide, the resulting decoding would select from 8*8*4 rows, which equals the set of 256 read port A word lines. However, it will be appreciated that the pre-decoded address signal bit width may be varied in alternative implementations.

A multiplexer (MUX) 325 that is analogous to multiplexer 320 selects between a read port B address (pB) 315 and write address 310 depending upon whether a read port B access or a write operation is active. During a write operation to an addressed row, multiplexer 325 selects for the write address 310. Conversely, multiplexer 325 selects for read port B address 315 is a read port B access is active. The bit width of read port B address 315 may be sufficient to uniquely identify the addressed row as discussed for read port A address 305. A pre-decoder 335 pre-decodes the selected address from multiplexer 325 into a set of read port B pre-decoded word line address signals. As discussed analogously with regard to pre-decoder 330, pre-decoder 335 pre-decodes the selected address into three different read port B pre-decoded word line address signals ra_pB, rb_pB, and rc_pB. However, the number of the read port B pre-decoded word line address signals and their bit width may be varied in alternative implementations. The read port B pre-decoded word line address signals are also denoted herein as pre-decoded second word line address signals.

Figure 4:
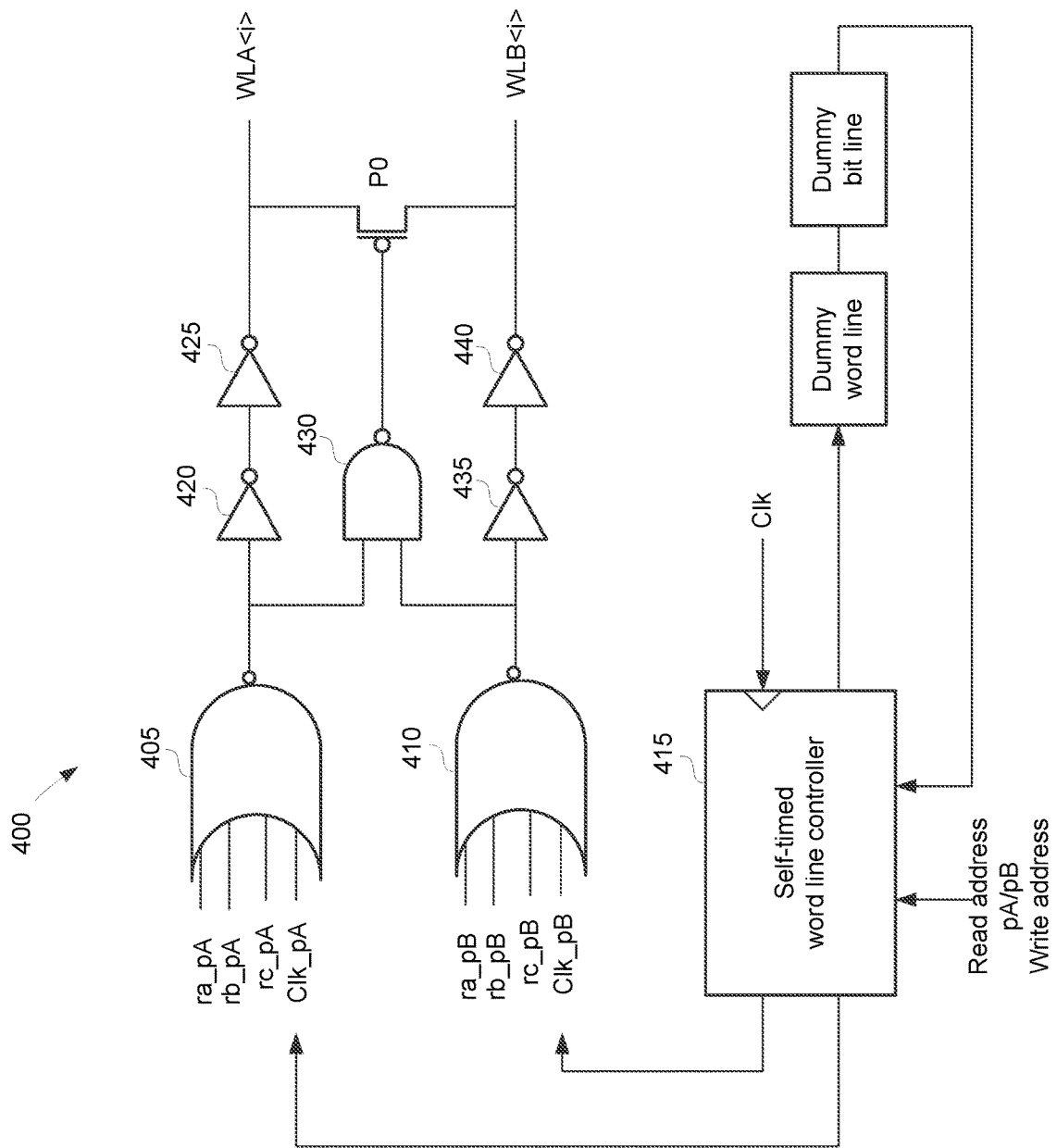
FIG. 4 illustrates the word line decoders for a word line pair and a word line controller for a pseudo-triple-port memory in accordance with an aspect of the disclosure.

A word line decoder 400 for decoding the pre-decoded word line addresses is shown in FIG. 4. For illustration clarity, decoder 400 is shown decoding for the ith row only but it will be appreciated that analogous decoding occurs for the remaining rows. A logic gate such as a NOR gate 405 processes a corresponding bit from each of the read port A word line pre-decoded address signals ra_pA, rb_pA, and rc_pA with an active-low port A clock signal (Clk_pA). Consider the example discussed earlier in which the pre-decoded first word line address signals ra_pA and rb_pA are both eight bits wide and the pre-decoded first word line address signal rc_pA is four bits wide. If there are 256 rows, there would thus be 256 NOR gates 405. Each NOR gate 405 is assigned a unique combination of the bits in the pre-decoded address signal. For example, one gate may be assigned the first bit in each of the pre-decoded first word line address signals ra_pA, rb_pA, and rc_pA. No other row may then correspond to this particular combination of bits. For each bit in the pre-decoded first word line address signal ra_pA, there are 32 unique assignments of bits in the remaining pre-decoded first word line address signals rb_pA and rc_pA if the bit width of rb_pA is eight bits and the bit width of rc_pA is four bits. Since there are eight bits in this example in the pre-decoded first word line address signal ra_pA, there are thus the desired 256 unique bit assignments in the pre-decoded first word line address signals to uniquely identify each row from the set of 256 rows. It will be appreciated that the number of rows may be smaller or larger than 256 in alternative implementations. But each NOR gate 405 for a particular row would have a unique assignment of a bit from each read port A pre-decoded word line address signal. Should the assigned bits and the read port A clock signal all be logic low in an active-low implementation, NOR gate 405 asserts its output signal. This asserted output signal is buffered through a serial pair of inverters 420 and 425 to assert the voltage of the ith row's read port A word line (WLA<i>).

A self-timed word line controller 415 asserts the port A clock signal in response to the assertion of a read port A (pA) address during a read operation. The read port A clock signal is also denoted herein as a first word line clock signal. In contrast to the pre-decoded word line address signals, the read port A clock signal may be generic to all the addressed rows. In other words, the read port A clock signal may be asserted whenever a read port A access or a write port access is active, regardless of which row is being addressed. Self-timed word line controller 415 responds to the assertion of the memory clock and the read port A address by asserting the read port A clock signal for a word line assertion period such as self-timed through a dummy word line and a dummy bit line mimicking the desired voltage development on the read port A word line (WLA<i>) and the true bit line BL. Word line controller 415 may thus be deemed to be "self-timed" as the timing of the word line assertion period depends upon the individual electrical properties of the memory. As used herein, a signal is deemed to be asserted when the signal is true, regardless of whether the true binary state is represented by a logic-high or a logic-low convention. Self-timed word line controller 415 is "double pumped" so it will assert the read port A clock signal for a second time in one cycle of the memory clock signal if the write address identifies one of the rows. Note that the pre-decoded word line address signals will be presented prior to the word line assertion period for either a read or a write operation. Self-timed word line controller 415 thus controls the duration of the word line assertion period for both the read and write operation. For example, the period of time over which self-timed word line controller 415 asserts the read port A clock signal determines the word line assertion period for the read port A word line.

Analogously as described for NOR gate 405, a logic gate such as a NOR gate 410 processes a corresponding bit from each of the read port B pre-decoded word line address signals ra_pB, rb_pB, and rc_pB with an active-low port B clock signal (Clk_pB). When a read port B access or a write port access is active to the ith row, the corresponding pre-decoded bits and the read port B clock signal will all be low so that NOR gate 410 asserts its output signal. A serial pair of inverters 435 and 440 buffer the asserted output signal from NOR gate 410 to assert a voltage of the ith row's read port B word line (WLB<i>).

Self-timed word line controller 415 responds to the memory clock and the activation of a read port B address to an addressed row to assert the read port B clock signal for a self-timed word line assertion period during a read port B access. Similarly, self-timed word line controller 415 responds to the memory clock and the activation of a write address to an addressed row to assert the read port B clock signal for a self-timed word line assertion period during a write port access. This write port access is double pumped as discussed earlier in that both a read operation and a write operation may occur in one cycle of the memory clock signal. As discussed with regard to the read port A clock signal, self-timed word line controller 415 controls the read port B word line assertion period by controlling the duration of the read port B clock signal assertion.

The electrical properties of inverter pairs 420, 425 and 435, 440 may vary. Similarly, the electrical properties of the read port A word line and the read port B word line to an addressed row may also vary. During a write operation, it is thus possible that NOR gates 405 and 410 would assert their output signals substantially simultaneously yet one of the word lines in a word line pair to an addressed row during a write operation may still be asserted prior to the other word line in the word line pair. To ensure a simultaneous word line development for an addressed row, the output signals from NOR gates 405 and 410 drive a logic gate such as a NAND gate 430. The assertion of the output signals from NOR gates 405 and 410 causes NAND gate 430 to ground its output signal. The output signal from NAND gate 430 drives a gate of a PMOS transistor P0 having a first drain/source terminal connected to the read port A word line and a second drain/source terminal connected to the read port B word line. Transistor P0 will thus be switched on in response to the output signals from NOR gates 405 and 410 so that the assertion of the word lines in an addressed pair during a write operation is simultaneous.

Referring again to column 100, although the write operation is differential to a pseudo-triple-port SRAM, the read operation is single-ended. As the number of rows is increased, the capacitance of the bit lines in a column will increase. With this increased capacitance, it will take longer and longer for an accessed bitcell to charge (or discharge) an accessed bit line to trigger a relatively simple single-ended sense amplifier such as inverters 115 and 120 to make a bit decision for the read operation. It is this advantageous to divide an array of pseudo-triple-port bitcells into banks. As defined herein, a bank refers to a subdivision of a column of bitcells such that the bitcells in a column assigned to one bank shares global read bit lines with the bitcells in the corresponding column assigned to a neighboring bank. For example, suppose a column of bitcells is split into an upper bank column and a lower bank column. There is thus a global read bit line A (GRBLA) for read port A and a global read bit line B (GRBLB) for read port B that are shared by the upper bank column and the lower bank column. In some implementations disclosed herein, multiple columns in each bank shares a pair of global read bit lines. In particular, suppose that two columns in each bank also share the pair of global read bit lines. The two columns in each bank are thus multiplexed by a global read bit line multiplexer onto a global read bit line depending upon which column and bank is being accessed and depending upon which read port is being accessed. Since the resulting multiplexer selects between two columns, such memory implementations are denoted herein as "MUX2." Note that the MUX2 global read bit line multiplexer not only selects between the adjacent columns in one bank but also from the corresponding pair of columns in the neighboring bank. If, on the other hand, each column in a bank does not share its global read bit lines with a neighboring column in the bank, there is still the multiplexing between the same columns in the neighboring banks onto the shared pair of global read bit lines. Such memory implementations are denoted herein as "MUX1."

The path from a bitcell through the accessed bit line to a corresponding global read bit line forms a read datapath. There are thus read datapaths for MUX1 arrays and read datapaths for MUX2 arrays. Similarly, there is a write datapath from the write driver through an accessed pair of bit lines to a bitcell. The write datapaths may be substantially the same regardless of whether an array is MUX1 or MUX2. The read datapaths for a MUX1 array are such that the bit line BL from the same column in an upper bank and an adjacent lower bank may drive the global read bit line A in common. Similarly, the complement bit line BLB from the same column in an upper bank and an adjacent lower bank may drive the global read bit line B in common.

Figures 5A, 5B:
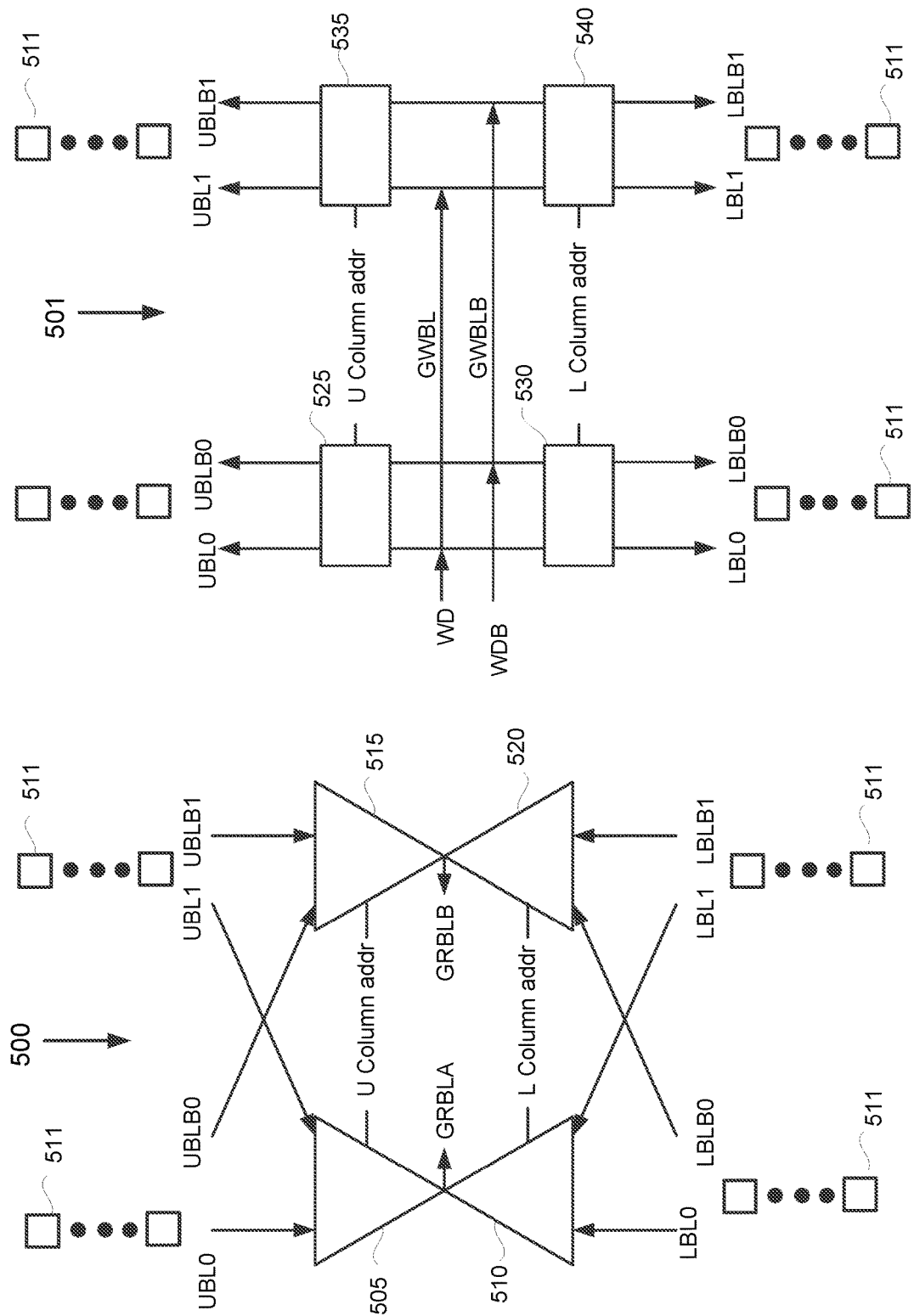
FIG. 5A illustrates the read datapaths for a pair of columns in two adjacent banks of a MUX2 pseudo-triple-port memory in accordance with an aspect of the disclosure.
FIG. 5B illustrates the write datapaths for a pair of columns in two adjacent banks of a MUX2 pseudo-triple-port memory in accordance with an aspect of the disclosure.

The read and write datapaths for MUX2 arrays will now be discussed in more detail. Some example read datapaths for a MUX2 array 500 are shown in FIG. 5A. MUX2 array 500 is divided into an upper bank and a lower bank. Each bit line for the upper bank may thus be designated as an upper bit line whereas each bit line for the lower bank may be designated as a lower bit line. For illustration clarity, just two columns are shown for the upper and lower banks: a zeroth column and a first column. Each column includes a plurality of bitcells 511. The bit lines for the zeroth column in the upper bank are designated as an upper bit line 0 (UBL0) and an upper complement bit line 0 (UBLB0). The bit lines for the first column in the upper bank are designated as an upper bit line 1 (UBL1) and an upper complement bit line 1 (UBLB1). Similarly, the bit lines for the zeroth column in the lower bank are designated as a lower bit line 0 (LBL0) and a lower complement bit line 0 (LBLB0). Finally, the bit lines for the first column in the lower bank are designated as a lower bit line 1 (LBL1) and a lower complement bit line 1 (LBLB1).

Recall that the bit line BL in column 100 of FIG. 1 forms part of the read port A for each of its bitcells whereas the complement bit line in column 100 forms part of the read port B for each of its bitcells. Referring again to FIG. 5A, bit lines UBL0 and LBL0 are thus part of the read port A for their corresponding bitcells. Similarly, bit lines UBL1 and LBL1 are part of the read port A for their corresponding bitcells. All of these "read port A associated" bit lines can drive a global read bit line A (GRBLA) depending upon which bank/column is being addressed for a read port A access. For example, a multiplexer 505 selects between the UBL0 and UBL1 bit lines based upon an upper column address (U column addr). If the upper column address is directed to read port A in the zeroth column, multiplexer 505 selects for the UBL0 bit line to drive the global read bit line A. Conversely, if the upper column address is directed to read port A in the first column, multiplexer 505 selects for the UBL1 bit line to drive the global read bit line A.

A multiplexer 510 is analogous to multiplexer 505 in that multiplexer 510 selects between the lower bank's read-port-A-associated bit lines in the zeroth and first columns when these columns are being addressed as determined by a lower column address (L Column addr). If the lower column address is directed to read port A in the zeroth column, multiplexer 510 selects for the LBL0 bit line to drive the global read bit line A. Conversely, if the lower column address is directed to read port A in the first column, multiplexer 510 selects for the LBL1 bit line to drive the global read bit line A.

The bit line selection for a global read bit line B (GRBLB) is analogous. For example, a multiplexer 515 selects between the UBLB0 and UBLB1 bit lines based upon the upper column address (U column addr). If the upper column address is directed to read port B in the zeroth column, multiplexer 515 selects for the UBLB0 bit line to drive the global read bit line B. Conversely, if the upper column address is directed to read port B in the first column, multiplexer 515 selects for the UBLB1 bit line to drive the global read bit line B.

A multiplexer 520 is analogous to multiplexer 515 in that multiplexer 520 selects between the read-port-B-associated bit lines in the zeroth and first columns when these columns in the lower bank are being addressed as determined by the lower column address. If the lower column address is directed to read port B in the zeroth column, multiplexer 520 selects for the LBLB0 bit line to drive the global read bit line B. Conversely, if the lower column address is directed to read port B in the first column, multiplexer 520 selects for the LBLB1 bit line to drive the global read bit line B.

The write datapaths for a MUX2 array 501 are shown in FIG. 5B. A write data bit (WD) as carried on a global write bit line and the complement write data bit (WDB) as carried on a complement global write bit line are passed through a corresponding pass gate depending upon which bank and which column is being addressed in the write operation. The pass gates act as a column multiplexer to distribute the write data bit WD and the complement write data bit WDB to the addressed bank and column. For example, if the upper column address (U column addr) is addressed to the zeroth column in the upper bank, a pass gate 525 opens so that the write data bit WD drives the UBL0 bit line and so that the complement write data bit WDB drives the UBLB0 bit line. Conversely, if the upper column address is addressed to the first column in the upper bank, a pass gate 535 opens so that the write data bit WD drives the UBL1 bit line and so that the complement write data bit WDB drives the UBLB1 bit line.

The write datapaths to the lower bank are analogous. For example, if the lower column address (L column addr) is addressed to the zeroth column in the lower bank, a pass gate 530 opens so that the write data bit WD drives the LBL0 bit line and so that the complement write data bit drives the LBLB0 bit line. Conversely, if the lower column address is addressed to the first column in the lower bank, a pass gate 540 opens so that the write data bit WD drives the LBL1 bit line and so that the complement write data bit WDB drives the LBLB1 bit line. The column multiplexing for the write datapaths in a MUX1 array is analogous.

Some example architectures for pseudo-triple-port bitcells will now be discussed. With regard to this architecture, note that substantial time and effort has been developed to implement a conventional six-transistor (6T) bitcell to minimize defects and provide the desired readability and writability. If this architecture is then disturbed to accommodate the pseudo-triple-port innovation disclosed herein, the write and read margins may suffer and the manufacturing defects may increase. Such a conventional 6T bitcell is traditionally accessed with a single word line. In contrast, the 6T bitcells disclosed herein are accessed through a pair of word lines that are controlled independently during a read operation depending upon which read port is being used. The following bitcell architectures (which may also be denoted herein as a layout) leverage the traditional 6T architecture such that the same advantageous "front-end" design may be recycled despite the pseudo-triple-port modifications.

Figure 6:
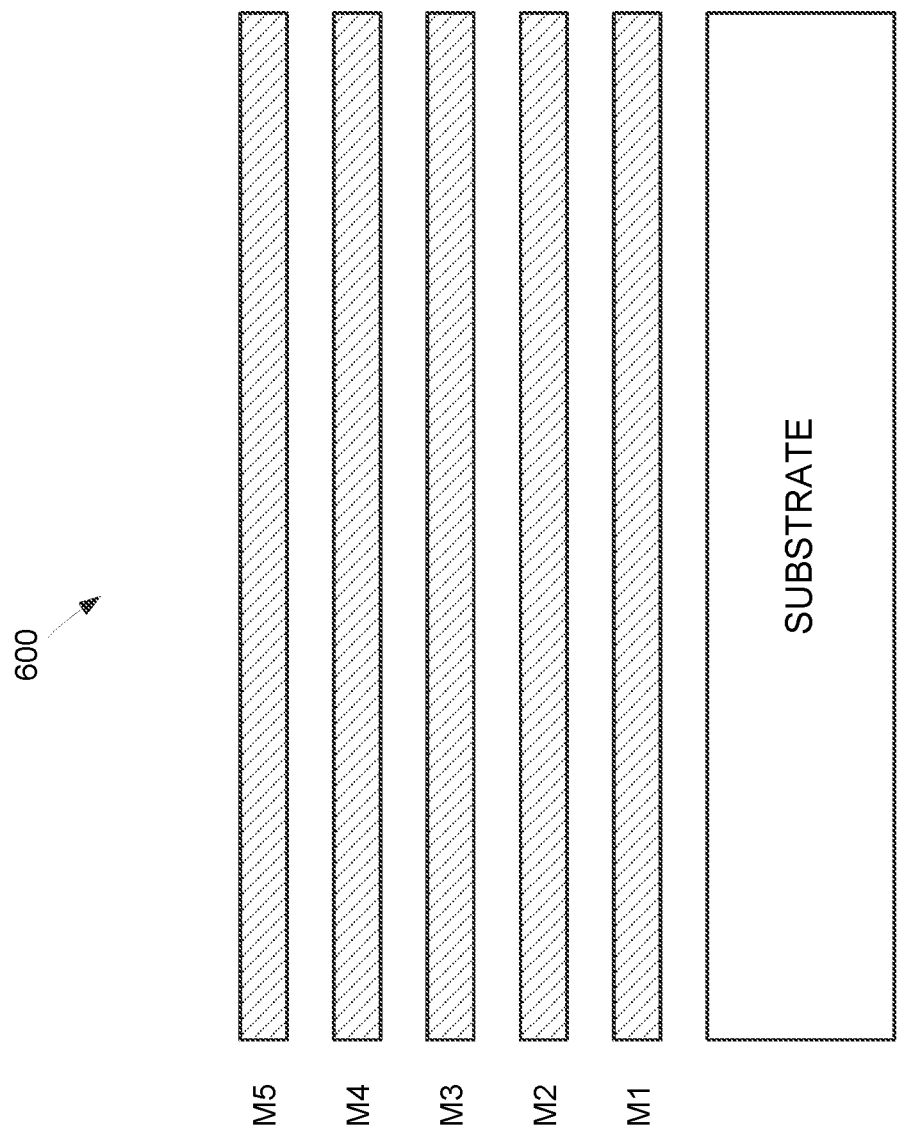
FIG. 6 is a cross-section of the semiconductor substrate and metal layers for a bitcell implementation in accordance with an aspect of the disclosure.

To better appreciate what is meant by a front-end design and the associated semiconductor manufacturing process, a cross-section of a semiconductor device 600 is shown in FIG. 6. The transistors and other active devices are implemented on a semiconductor substrate. To provide power, ground, and the various signals used by the transistors, metal layers adjacent to the semiconductor substrate are patterned into the appropriate leads or conductors. For example, a first metal layer M1 is immediately adjacent the semiconductor substrate. Additional metal layers above metal layer M1 are consecutively numbered such that there is a second metal layer M2, a third metal layer M3, a fourth metal layer M4, and a fifth metal layer M5. Additional metal layers above M5 may also be used but are not shown for illustration clarity. In addition, a zeroth metal layer used for interconnects directly to the active devices on the semiconductor substrate is also not shown for illustration clarity. The front-end design concerns the layout for the semiconductor substrate and the zeroth metal layer. The layout for the remaining metal layers M1 through M5 (and any higher order metal layers) is denoted as the back-end design.

Figure 7:
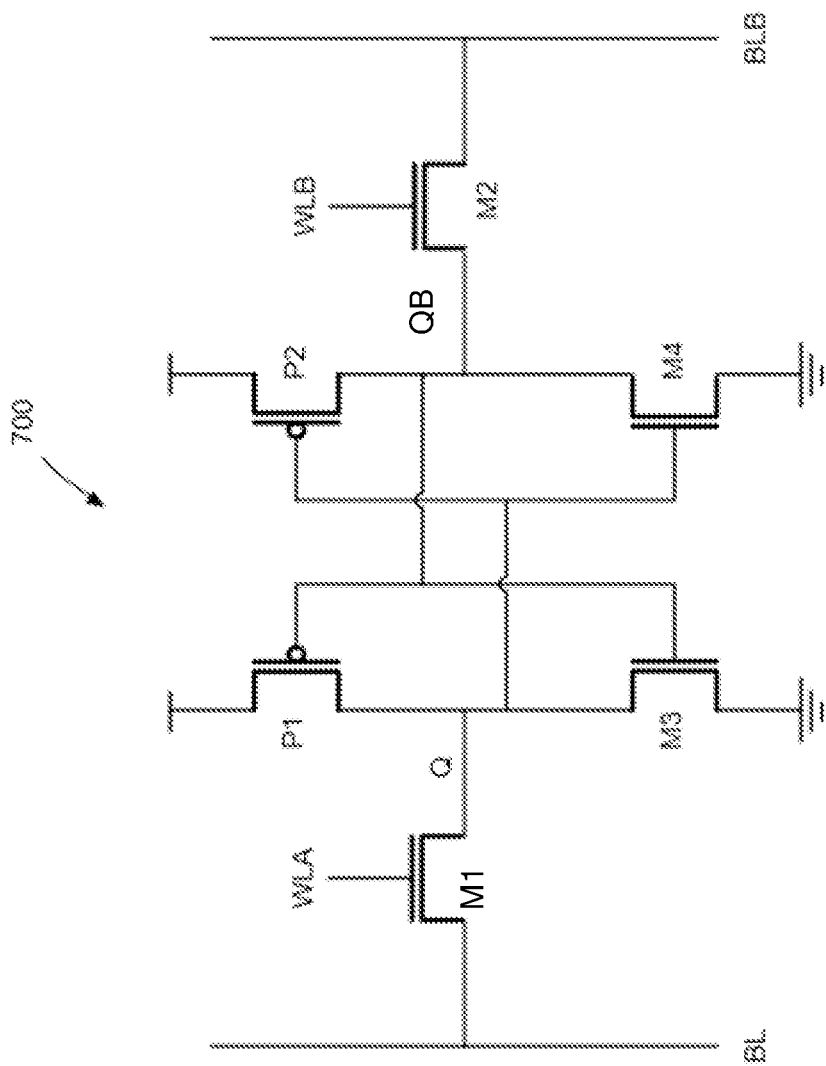
FIG. 7 is a circuit diagram of a 6-transistor (6T) bitcell in accordance with an aspect of the disclosure.

To keep the advantageous write margins, read margins, and other properties that have been exhaustively designed into a conventional 6T SRAM bitcell, the front-end design is left undisturbed. Even in the back-end design, metal layer M1 may be left undisturbed from its layout for a conventional 6T bitcell. Advantageously, the global bit lines, the global write lines, and the word lines for the pseudo-triple-port bitcells disclosed herein may be accommodated through changes to just metal layers M3, M4, and M5. Indeed, metal layer M2 is also left substantially unchanged. With regard to these advantageous features, an example pseudo-triple-port bitcell 700 is shown in more detail in FIG. 7. Bit lines BL and BLB as well as access transistors M1 and M2 are arranged as discussed for bitcells 105 and 110. The cross-coupled inverter driving the Q output node is formed by a serial combination of a PMOS transistor P1 and a NMOS transistor M3. Similarly, the cross-coupled inverter driving the QB output node is formed by a serial combination of a PMOS transistor P2 and an NMOS transistor M4. The sources of transistors P1 and P2 are connected to the power supply node for the power supply voltage VDD. Similarly, the sources of transistors M3 and M4 are connected to ground. The Q output node drives the gates of transistors P2 and M4 whereas the QB output node drives the gates of transistors P1 and M3.

Figure 8:
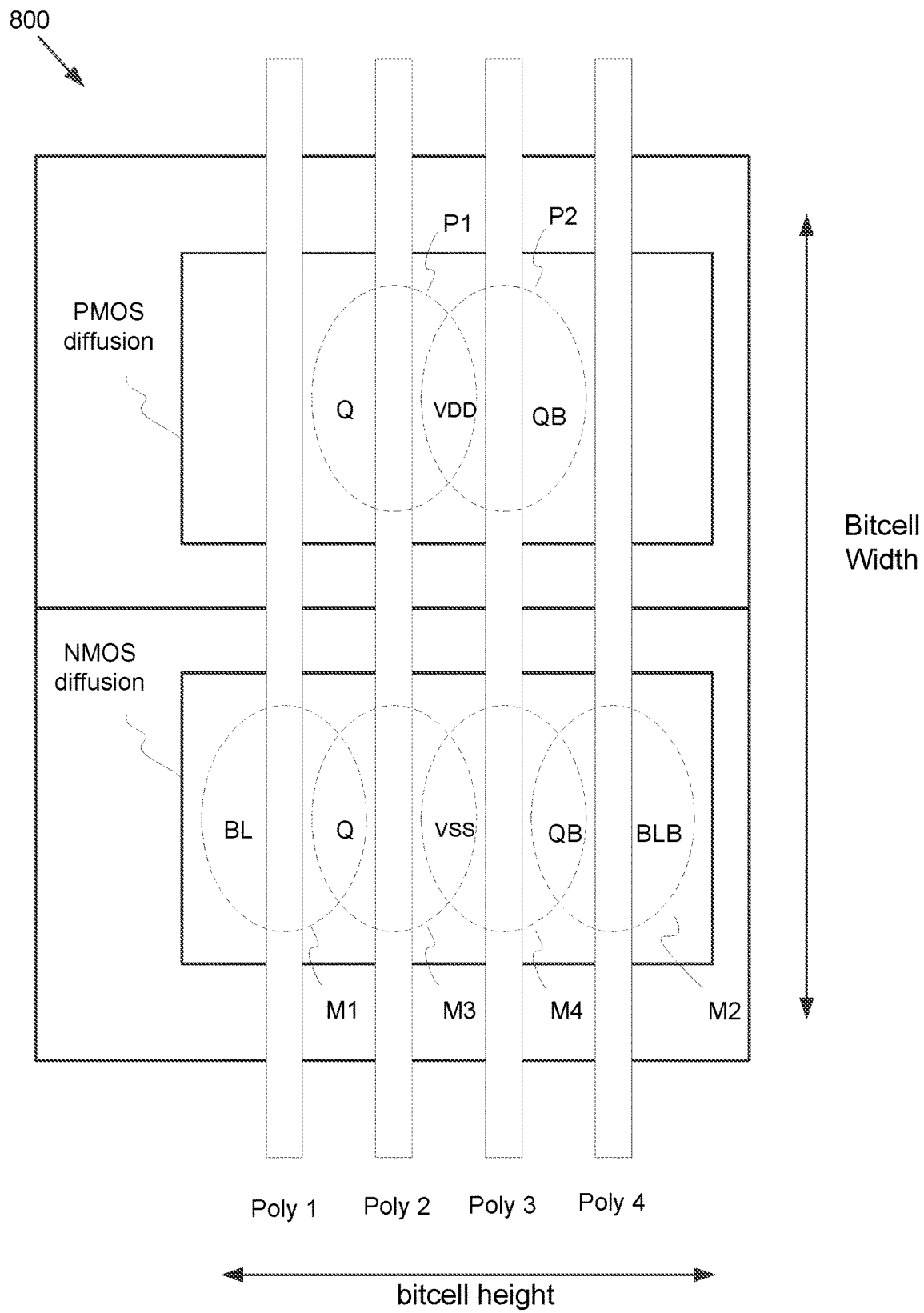
FIG. 8 illustrates the semiconductor layout for a 6T bitcell in accordance with an aspect of the disclosure.

The six transistors P1, P2, M1, M2, M3, and M4 in a bitcell 800 may be laid out on the semiconductor substrate within a four polysilicon line pitch as shown in FIG. 8. A PMOS diffusion region forms the source and drains of the PMOS transistors. Similarly, an NMOS diffusion region forms the source and drains of the NMOS transistors. The polysilicon lines cross the diffusion regions to form their gates. For example, a gate of access transistor M1 is formed by a first polysilicon line (poly 1) at its intersection with the NMOS diffusion region. One drain/source region for access transistor M1 is driven by the bit line BL whereas another drain/source region is driven by the Q output node. A second polysilicon line (Poly 2) crosses the diffusion regions to form the gates of transistors P1 and M3. A third polysilicon line (Poly 3) crosses the diffusion regions to form the gates of transistors P2 and M4. Finally, a fourth polysilicon line (Poly 4) crosses the NMOS diffusion region to form the gate of access transistor M2. Since this four-poly pitch layout is conventional, the source/drain contacts to transistors P1, P2, M3, M4 and M2 will not be discussed further. But note that considerable effort and expense has been expended to optimize the layout for such a 6T SRAM bitcell. As discussed previously, this conventional (and optimized) 6T SRAM bitcell layout is advantageously preserved despite the pseudo-triple-port modifications disclosed herein.

Comparing bitcells 105 and 800, it may be seen that bitcell 800 is rotated 90 degrees as compared to bitcell 105. The four polysilicon line (four poly) pitch defined by the first through the fourth polysilicon lines thus defines a bitcell height for each bitcell in a row of an array of bitcells 800. Similarly, the two diffusion region pitch defines the bitcell width for each bitcell in a column in the array. The bitcell height (which may also be denoted as the row height) is less than the bitcell width (which may also be denoted as the column width) so it is challenging to place the word line pair in a metal layer within the row height without affecting the 6T bitcell layout.

Referring again to FIG. 6, the first metal layer may be readily patterned within the column width to form the local bit lines Bl and BLB. In addition, the first metal layer may be patterned to form a power supply rail for the power supply voltage VDD. The second metal layer M2 is patterned to form the ground nodes for bitcell 800. The metal layer patterning for the word lines depends upon whether the column including bitcell 800 is a MUX1 or a MUX2 column. Recall that the MUX2 read datapaths discussed with regard to MUX2 array 500 allow two different columns to share a pair of global read bit lines for the two read ports in each column. As discussed with regard to MUX2 array 501, a pair of global write bit lines for carrying the write data bit signal WD and its complement WDB are also multiplexed to the two columns. The four global bit lines (two for read and two for write) may thus be distributed across the width of the corresponding two columns in a MUX2 array. In contrast, the set of four global bit lines must lie within a single column width for a MUX1 array.

Figure 9:
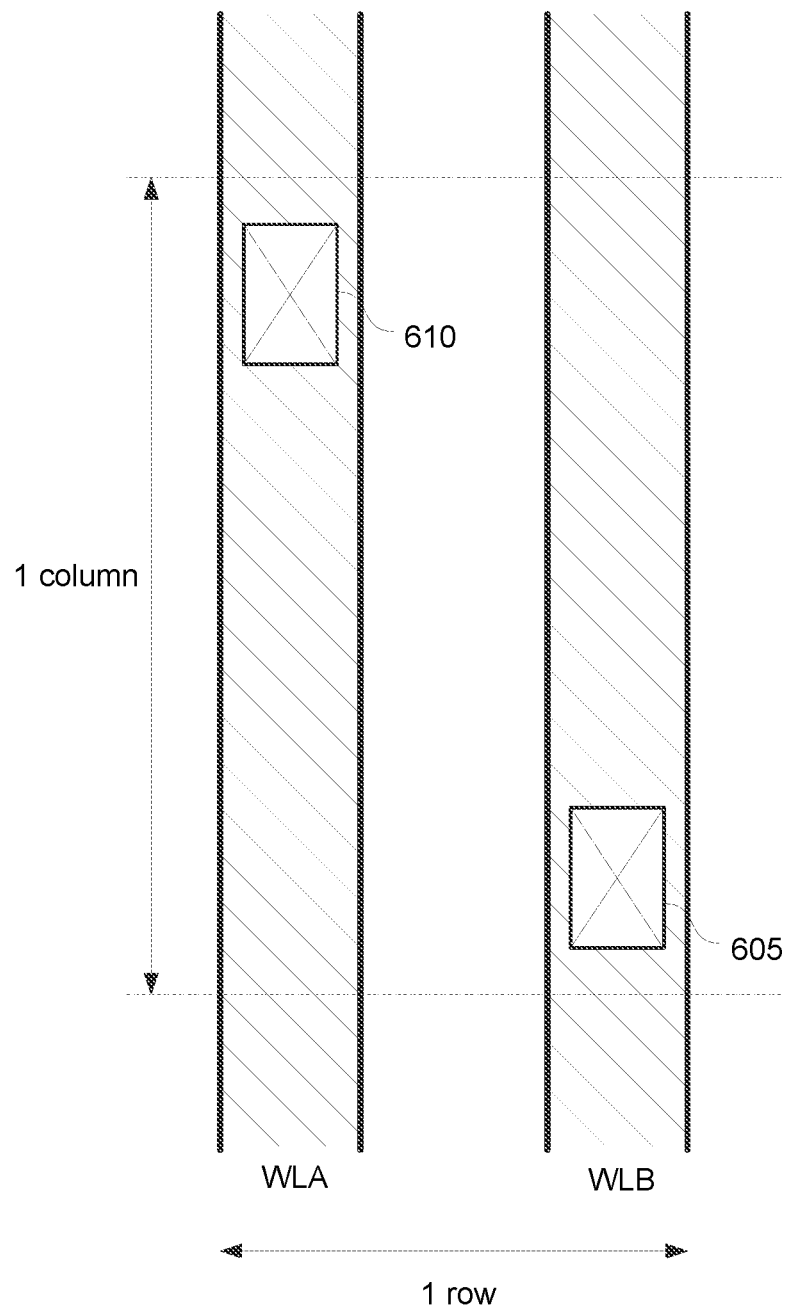
FIG. 9 illustrates a metal layer patterning to form the word line pair for a pseudo-triple-port 6T bitcell row in either a MUX1 array or a MUX2 array in accordance with an aspect of the disclosure.

Since the routing of the four global bit lines is less crowded in a MUX2 array, two adjacent metal layers may be dedicated to the routing of the word line pair to a pseudo-triple-port bitcell. For example, both metal layer M3 and metal layer M4 may be patterned to form leads for the word line pair. Given that the patterning may be the same for both metal layers, a word line pair 900 shown in FIG. 9 is representative of the metal layer patterning for both metal layer M3 and metal layer M4 in a MUX2 array. The first read port word line WLA drives a via 610 that couples through metal layers M2 and M1 to the zeroth metal layer M0 to drive the gate of access transistor M1. Similarly, the second read port word line WLB drives a via 605 that couples to the gate of access transistor M2. Since both these access transistors need to be driven by a common word line in a conventional 6T bitcell, the locations of vias 605 and 610 may be substantially unchanged from their conventional location such that the routing of metal layer M1 may be conventional. This is quite advantageous in preserving the optimized 6T bitcell properties for the pseudo-triple-port bitcells disclosed herein. The resulting word line resistance for the word line pair is reduced in a MUX2 implementation because the word line pair is repeated in both metal layer M3 and metal layer M4 as coupled together through vias 610 and 605.

Figure 10:
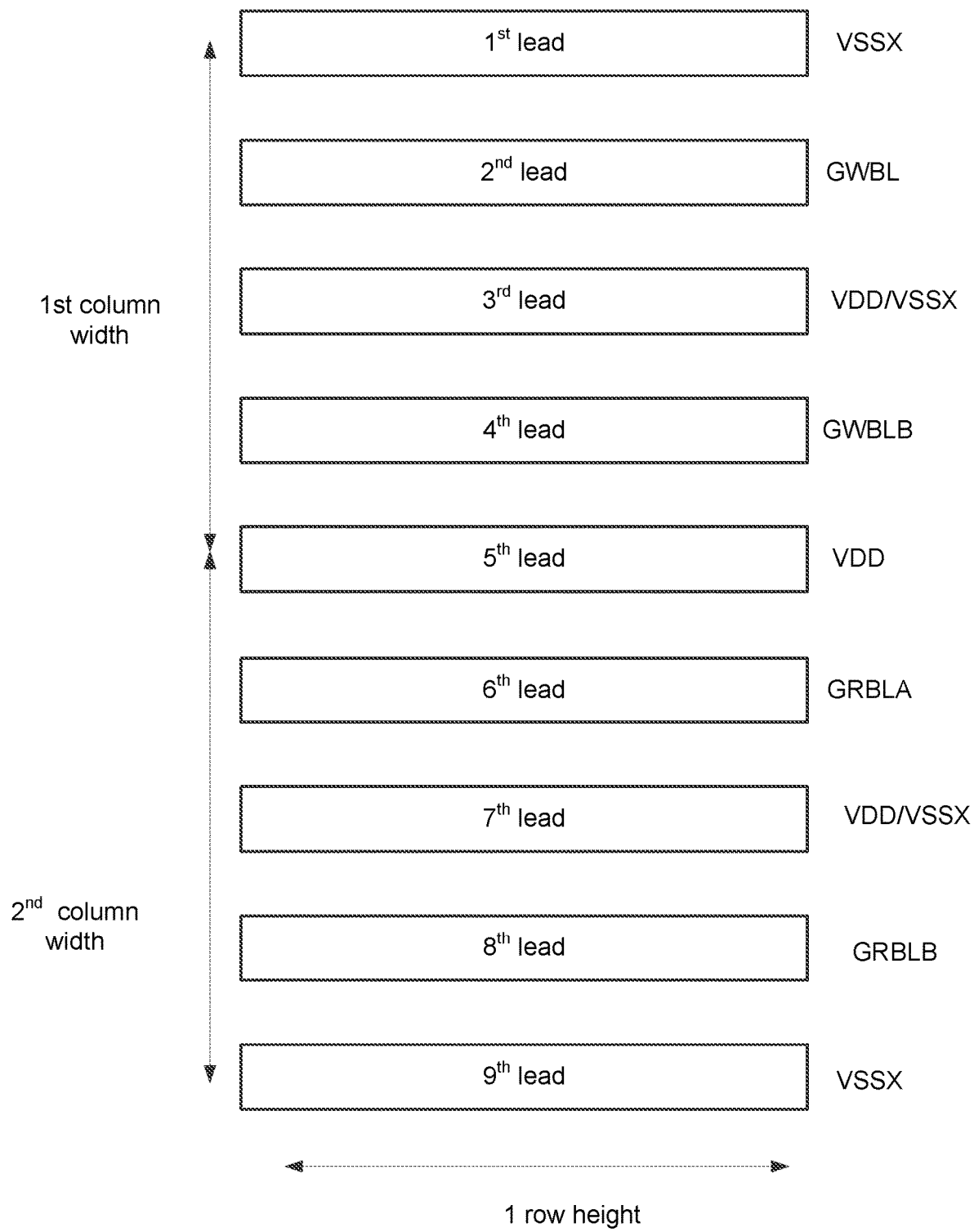
FIG. 10 illustrates a metal layer patterning to form the global bit lines for a pair of columns in a MUX2 array in accordance with an aspect of the disclosure.

The four global bit lines may be distributed across the width of the two multiplexed columns in a MUX2 memory implementation as shown in FIG. 10 for the patterning of the metal layer M5. A first lead in a first column is shared with a zeroth column (not illustrated). The first lead may be used for ground (VSSX). A second lead forms the global write bit line (GWBL). Referring again to the write datapaths in MUX2 array 501, the global write bit line GWBL carries the write data bit WD. A third lead (VDD/VSSX) may be used for supplying either ground or the power supply voltage VDD depending upon the implementation. A fourth lead in the first column width of FIG. 10 forms the complement global write bit line for carrying the complement write data bit WDB. A fifth lead is shared by both the first column and the second column and may carry the power supply voltage VDD.

The second column includes a sixth lead for forming the global read bit line A (GRBLA). A seventh lead (VDD/VSSX) may be used for the power supply voltage VDD or ground depending upon the implementation. An eighth lead forms the global read bit line B (GRBLB). Finally, a ninth lead that is shared with a third column (not illustrated) may provide ground. In this fashion, the global bit lines are distributed across the two columns shown in FIG. 10.

Figure 11:
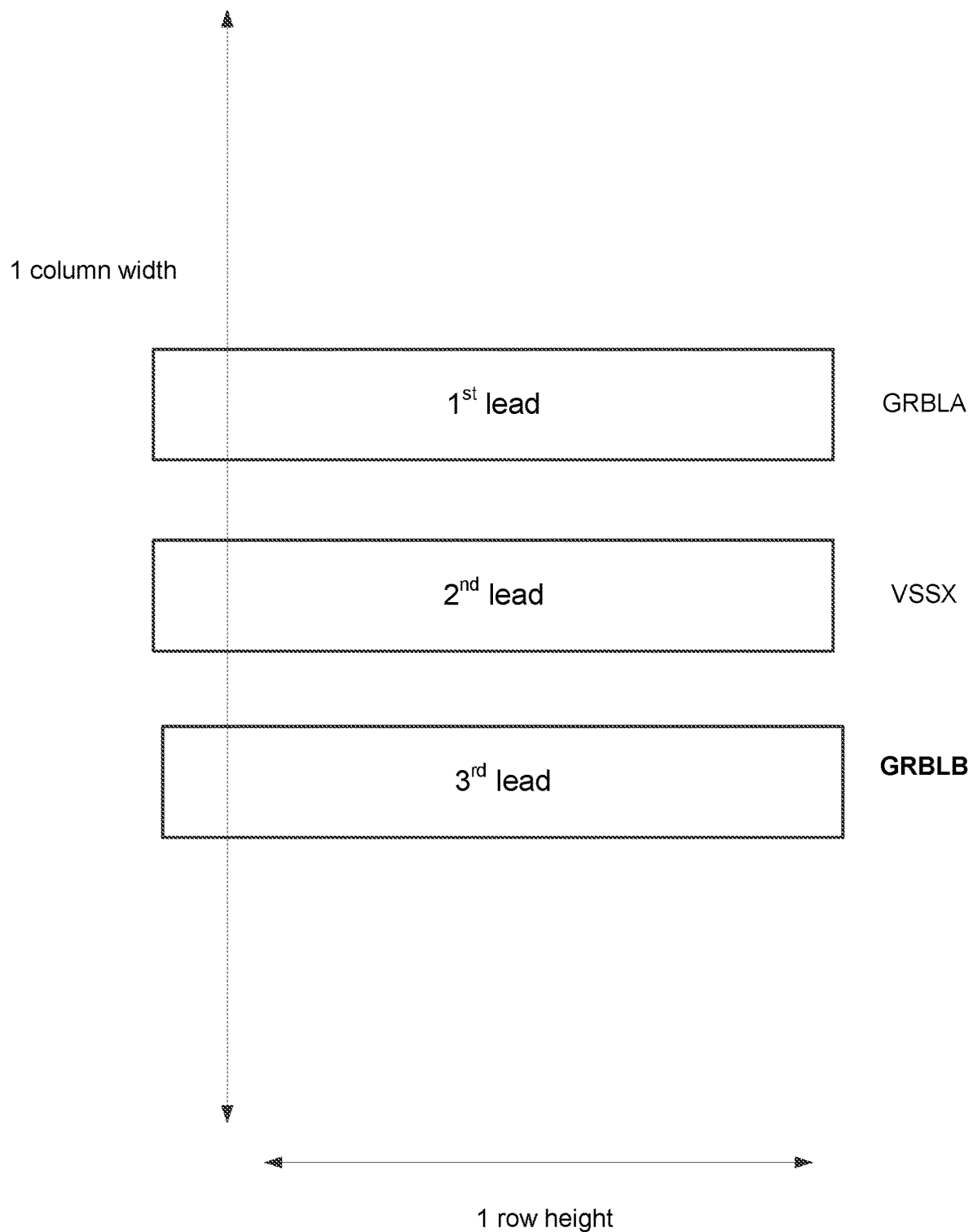
FIG. 11 illustrates a metal layer patterning to form the global read port bit lines for a column in a MUX1 array in accordance with an aspect of the disclosure.

In a MUX1 memory implementation, the global bit lines are instead carried within the width of the single column to which they are dedicated. To accommodate this restriction, metal layer M3 is patterned to form a first pair of the global bit lines. For example, a first lead in metal layer M3 is patterned to form the global read bit line A (GRBLA) as shown in FIG. 11 for a MUX1 array. A second lead may be used for ground (VSSX). A third lead forms the global read bit line B (GRBLB). In an alternative implementation, the global write bit lines may instead be placed in metal layer M3 for a MUX1 array. Since the metal layer M3 is being used to form a pair of the global bit lines, only metal layer M4 is used to form the word lines as discussed with regard to FIG. 9. The use of a single metal layer to form the word line pair raises the word line resistance as compared to a MUX2 implementation but provides the routing space for the global bit line pair in metal layer M3. Metal layer M4 is thus patterned the same to form a word line pair regardless of whether the array is a MUX1 or a MUX2 array.

Figure 12:
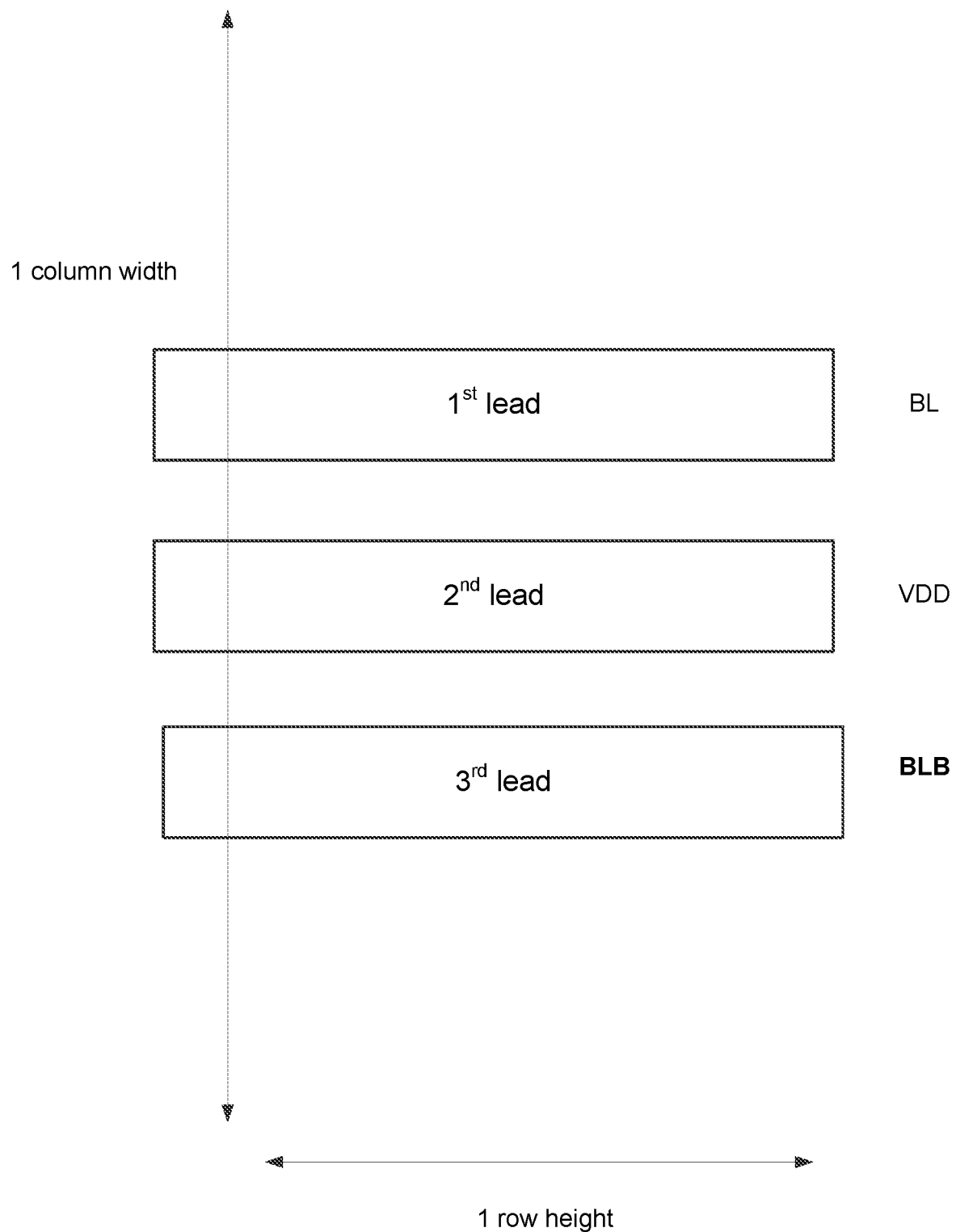
FIG. 12 illustrates a metal layer patterning to form the local bit lines for a column in either a MUX1 array or a MUX2 array in accordance with an aspect of the disclosure.

An analogous patterning as discussed for FIG. 11 may be used to pattern the M1 metal layer to form the local bit lines BL and BLB as shown in FIG. 12. A first lead forms the local bit line BL whereas a third lead forms the complement local bit line BLB. A second lead separates the first and third leads and may be used to carry the power supply voltage VDD. Advantageously, metal layer M1 may be patterned the same as for a conventional 6T bitcell so that its optimized properties may be shared with the pseudo-triple-port memories disclosed herein.

Figure 13:
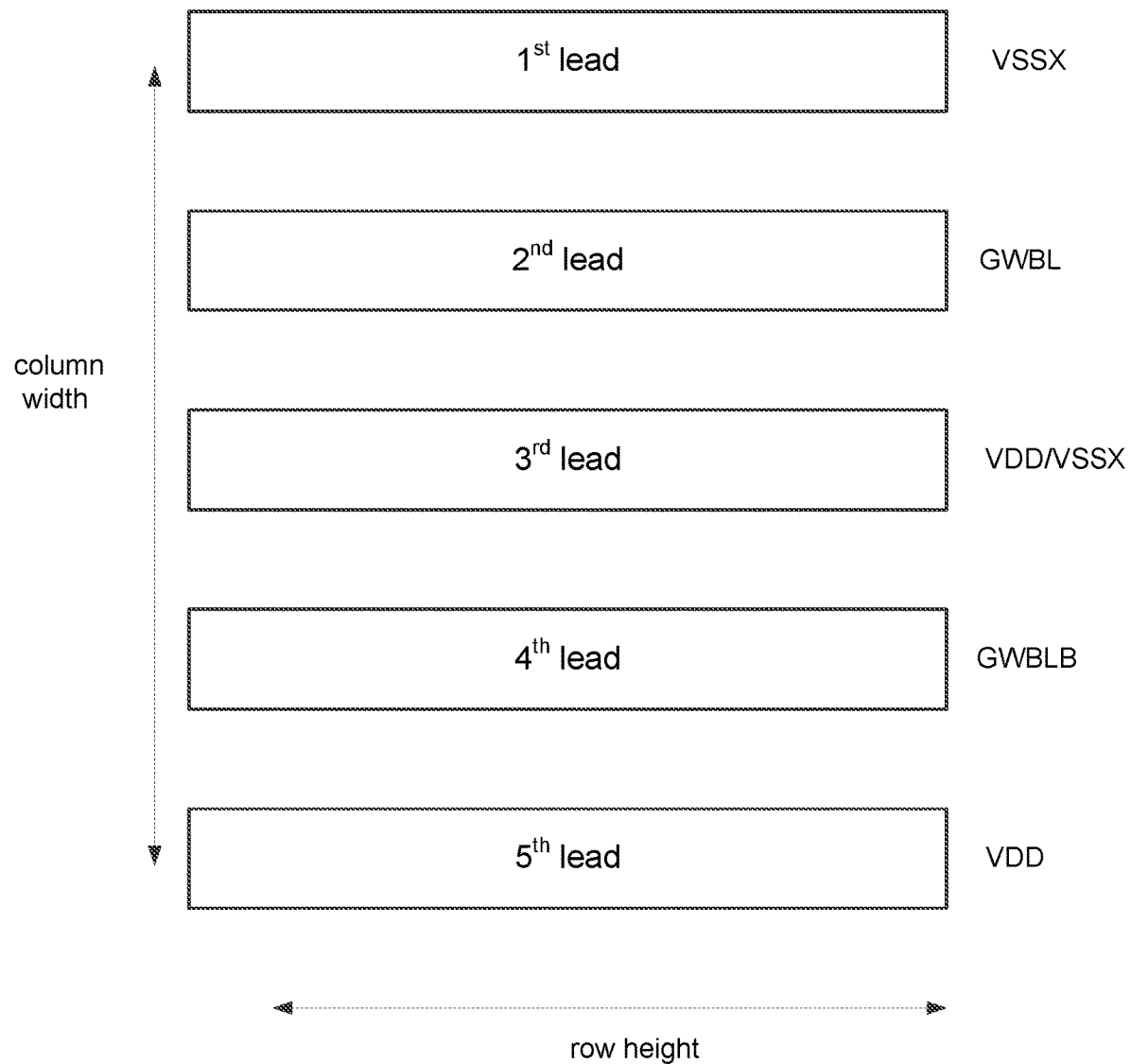
FIG. 13 illustrates a metal layer patterning to form the global write port bit lines for a column in a MUX1 array in accordance with an aspect of the disclosure.

The patterning of metal layer M5 for a MUX1 array is shown in FIG. 13. A first lead is shared with a preceding column (not illustrated) and may be used to supply ground. A second lead forms the global write bit line (GWBL). A third lead (VDD/VSSX) may be used for the power supply voltage VDD or ground depending upon the implementation. A fourth lead forms the complement global write bit line (GWBLB). Finally, a fifth lead is shared with a subsequent column (not illustrated) and may be used to supply the power supply voltage VDD.

An example method of manufacturing a pseudo-triple-port bitcell will now be discussed with regard to the flowchart of FIG. 14. The method includes an act 1400 of forming a bitcell arranged on a semiconductor substrate, the bitcell having a bitcell width and a bitcell height and including a first access transistor and a second access transistor. The formation of bitcell 700 is an example of act 1400. The method further includes an act 1405 of patterning a first metal layer adjacent the semiconductor substrate to form a pair of local bit lines arranged within the bitcell width, the pair of local bit lines including a local bit line coupled to a terminal of the first access transistor and including a complement local bit line coupled to a terminal of the second access transistor. The patterning of metal layer M1 to form the local bit line pair is an example of act 1405. Finally, the method includes an act 1410 of patterning a third metal layer adjacent to a second metal layer that is adjacent to the first metal layer to form a pair of word lines arranged within the bitcell height, the pair of word lines including a first read port word line coupled to a gate of the first access transistor and including a second read port word line coupled to a gate of the second access transistor. The patterning of metal layer M3 to form the word line pair is an example of act 1410.

Figure 15:
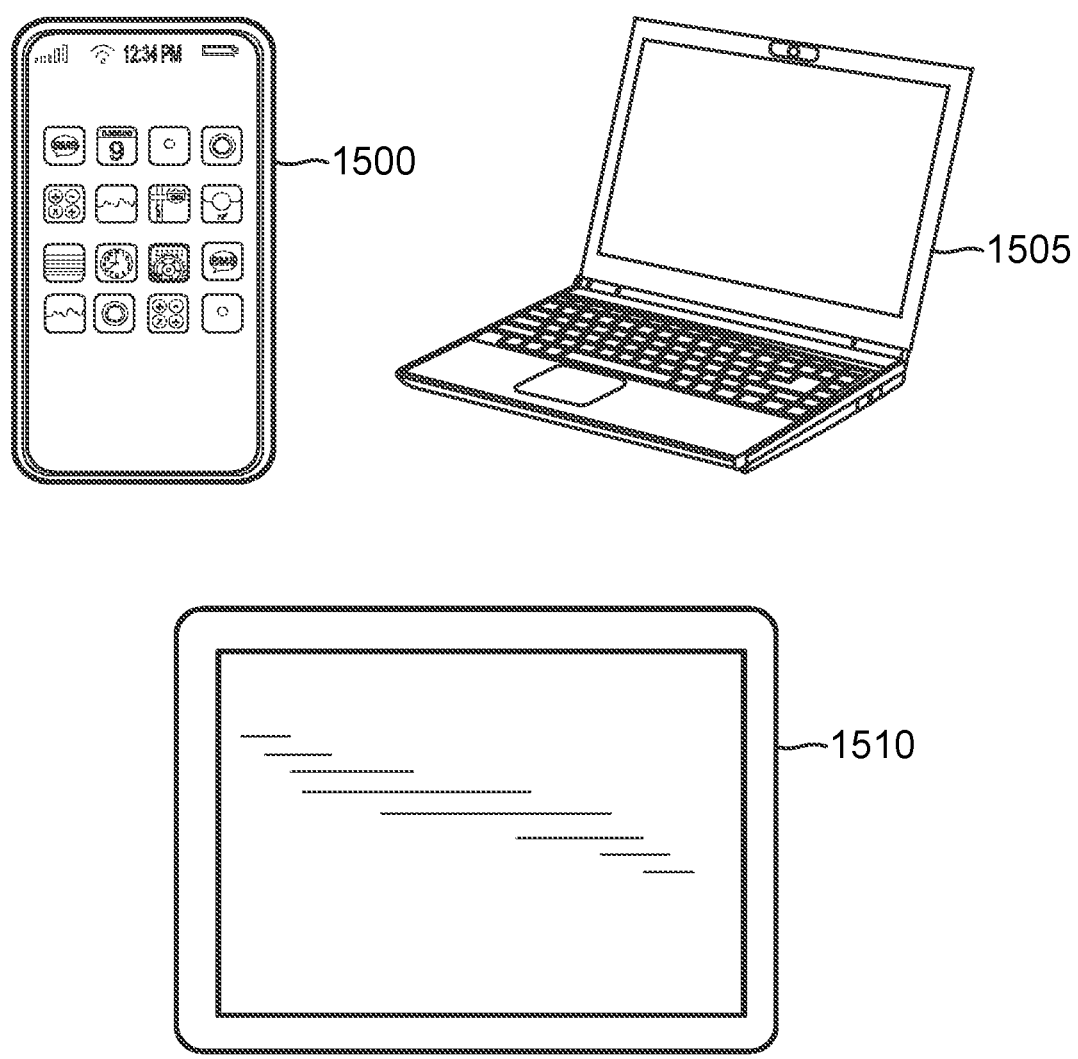
FIG. 15 illustrates some example electronic systems each incorporating a pseudo-triple-port memory having a bitcell architecture in accordance with an aspect of the disclosure.

A pseudo-triple-port memory with the advantageous bitcell architecture disclosed herein may be incorporated into a wide variety of electronic systems. For example, as shown in FIG. 15, a cell phone 1500, a laptop 1505, and a tablet PC 1510 may all include a pseudo-triple-port memory with a bitcell architecture in accordance with the disclosure. Other exemplary electronic systems such as a music player, a video player, a communication device, and a personal computer may also be configured with memories constructed in accordance with the disclosure.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

What is claimed is:

1. A memory, comprising:
a semiconductor substrate;
a bitcell arranged on the semiconductor substrate, the bitcell having a bitcell width and a bitcell height and including a first access transistor and a second access transistor;
a first metal layer adjacent the semiconductor substrate, the first metal layer being patterned to form a pair of local bit lines arranged within the bitcell width; the pair of local bit lines including a local bit line coupled to a terminal of the first access transistor and including a complement local bit line coupled to a terminal of the second access transistor;
a second metal layer adjacent the first metal layer; and
a third metal layer adjacent the second metal layer, the third metal layer being patterned to form a first pair of word lines arranged within the bitcell height, the pair of word lines including a first read port word line coupled to a gate of the first access transistor and including a second read port word line coupled to a gate of the second access transistor.

2. The memory of claim 1, further comprising:
a fourth metal layer adjacent the third metal layer, the fourth metal layer being patterned into a second pair of word lines arranged within the bitcell height, the second pair of word lines including an extra first read port word line coupled to the gate of the first access transistor and an extra second read port word line coupled to the gate of the second access transistor.

3. The memory of claim 2, further comprising:
a fifth metal layer adjacent the fourth metal layer, the fifth metal layer being patterned into a pair of global bit lines arranged within the bitcell height.

4. The memory of claim 3, wherein the pair of global bit lines comprises a first read port global bit line and a second read port global bit line.

5. The memory of claim 4, wherein the fifth metal layer is further patterned into a ground lead, the ground lead being arranged between the first read port global bit line and the second read port global bit line.

6. The memory of claim 4, wherein the fifth metal layer is further patterned into a power supply voltage lead, the power supply voltage lead being arranged between the first read port global bit line and the second read port global bit line.

7. The memory of claim 3, wherein the pair of global bit lines comprises a global write bit line and a complement global write bit line.

8. The memory of claim 7, wherein the fifth metal layer is further patterned into a ground lead, the ground lead being arranged between the global write bit line and the complement global write bit line.

9. The memory of claim 7, wherein the fifth metal layer is further patterned into a power supply voltage lead, the power supply voltage lead being arranged between the global write bit line and the complement global write bit line.

10. The memory of claim 1, wherein the first metal layer is further patterned into a power supply voltage lead, the power supply voltage lead being arranged between the local bit line and the complement local bit line.

11. The memory of claim 1, wherein the memory is included within a cellular telephone.

12. A method, comprising:
forming a bitcell arranged on a semiconductor substrate, the bitcell having a bitcell width and a bitcell height and including a first access transistor and a second access transistor;
patterning a first metal layer adjacent the semiconductor substrate to form a pair of local bit lines arranged within the bitcell width, the pair of local bit lines including a local bit line coupled to a terminal of the first access transistor and including a complement local bit line coupled to a terminal of the second access transistor; and
patterning a third metal layer adjacent to a second metal layer that is adjacent to the first metal layer to form a pair of word lines arranged within the bitcell height, the pair of word lines including a first read port word line coupled to a gate of the first access transistor and including a second read port word line coupled to a gate of the second access transistor.

13. The method of claim 12, further comprising:
patterning a fourth metal layer adjacent the third metal layer into an extra pair of word lines arranged within the bitcell height, the extra pair of word lines including an extra first read port word line coupled to the gate of the first access transistor and an extra second read port word line coupled to the gate of the second access transistor.

14. The method of claim 13, further comprising:
patterning a fifth metal layer adjacent the fourth metal layer into a pair of global bit lines arranged within the bitcell height.

15. A memory, comprising:
a semiconductor substrate;
a bitcell arranged on the semiconductor substrate, the bitcell having a bitcell width and a bitcell height and including a first access transistor and a second access transistor;
a first metal layer adjacent the semiconductor substrate, the first metal layer being patterned to form a pair of local bit lines arranged within the bitcell width; the pair of local bit lines including a local bit line coupled to a terminal of the first access transistor and including a complement local bit line coupled to a terminal of the second access transistor;
a second metal layer adjacent the first metal layer;
a third metal layer adjacent the second metal layer, the third metal layer being patterned to form a first pair of global bit lines for the bitcell; and
a fourth metal layer adjacent the third metal layer, the fourth metal layer being patterned to form a pair of word lines arranged within the bitcell height, the pair of word lines including a first read port word line coupled to a gate of the first access transistor and including a second read port word line coupled to a gate of the second access transistor.

16. The memory of claim 15, wherein the first pair of global bit lines comprises a first read port global bit line and a second read port global bit line.

17. The memory of claim 16, further comprising:
a fifth metal layer adjacent the fourth metal layer, the fifth metal layer being patterned to form a second pair of global bit lines arranged within the bitcell height.

18. The memory of claim 17, wherein the second pair of global bit lines comprise a global write bit line and a complement global write bit line.

19. The memory of claim 18, wherein the fifth metal layer is further patterned into a ground lead arranged between the global write bit line and the complement global write bit line.

20. The memory of claim 18, wherein the fifth metal layer is further patterned into a power supply voltage lead arranged between the global write bit line and the complement global write bit line.

21. A method, comprising:
forming a bitcell arranged on a semiconductor substrate, the bitcell having a bitcell width and a bitcell height and including a first access transistor and a second access transistor;
patterning a first metal layer adjacent the semiconductor substrate to form a pair of local bit lines arranged within the bitcell width, the pair of local bit lines including a local bit line coupled to a terminal of the first access transistor and including a complement local bit line coupled to a terminal of the second access transistor
patterning a third metal layer adjacent to a second metal layer that is adjacent to the first metal layer to form a first pair of global bit lines for the bitcell; and
patterning a fourth metal layer adjacent the third metal layer to form a pair of word lines arranged within the bitcell height, the pair of word lines including a first read port word line coupled to a gate of the first access transistor and including a second read port word line coupled to a gate of the second access transistor.

22. The method of claim 21, further comprising:
patterning a fifth metal layer adjacent the fourth metal layer to form a second pair of global bit lines arranged within the bitcell height.

23. The method of claim 22, wherein the patterning of the fifth metal layer to form the second pair of global bit lines comprises forming a global write bit line and a complement global write bit line.

24. The method of claim 23, further comprising:
patterning the fifth metal layer to form a ground lead arranged between the global write bit line and the complement global write bit line.

25. The method of claim 23, further comprising:
patterning the fifth metal layer to form a power supply voltage lead arranged between the global write bit line and the complement global write bit line.

* * * * *